United States Patent
Voutsas

Patent Number: 6,071,796
Date of Patent: Jun. 6, 2000

[54] METHOD OF CONTROLLING OXYGEN INCORPORATION DURING CRYSTALLIZATION OF SILICON FILM BY EXCIMER LASER ANNEAL IN AIR AMBIENT

[75] Inventor: Tolis Voutsas, Portland, Oreg.

[73] Assignee: Sharp Laboratories of America, Inc., Camas, Wash.

[21] Appl. No.: 09/183,108

[22] Filed: Oct. 30, 1998

[51] Int. Cl.$^7$ ................................................ H01L 21/324
[52] U.S. Cl. ......................... 438/487; 438/166; 438/935; 438/937
[58] Field of Search .................................. 438/166, 487, 438/795, 937, 935, FOR 184, FOR 334, FOR 460; 117/10

[56] References Cited

U.S. PATENT DOCUMENTS

| 5,147,826 | 9/1992 | Liu et al. |
| 5,773,329 | 6/1998 | Kuo ................................................ 438/162 |

FOREIGN PATENT DOCUMENTS 42-86318  10/1992  Japan .

OTHER PUBLICATIONS

Voutsas, T. et al., "Characteristics of Excimer Laser Annealed Polysilicon . . . Thin Film Transistor Devices", Proceedings of the SPIE, vol. 3014, p. 112–118, 1997.

Article entitled, Excimer–Laser–Annealed Poly–Si Thin–Film Transistors by S.D. Brotherton, D.J. McCullock, J.B. Clegg and J.P. Gowers, published in IEEE Transactions on Electron Devices, vol. 40, No. 2, Feb. 1993, pp. 407–413.

Article entitled, "Effects of Oxygen on Crystallization of Amorphous Silicon Films and Polysilicon TFT Characteristics" by Yong–Min Ha, Seong–Hoon Lee, Chul–Hi Han and Choong–Ki Kim, published in Journal of Electronic Materials, vol. 23, No. 1, 1994, pp. 39–45.

Article entitled, "Surface Roughness Effects in Laser Crystallized Polycrystalline Silicon" by D.J. McCulloch and S.D. Brotherton, published in Appl. Phys. Lett. 66(16), Apr. 1995, pp. 2060–2062.

Article entitled, "Oxygen effect on the electrical characteristics of polycrystalline silicon films", by R. Angelucci, L. Dori and M. Severi, published in Appl. Phys. Lett. 39(4), Aug. 1981, pp. 346–348

Article entitled, "Comprehensive Study of Lateral Grain Growth in PolyOSi Films by Excimer Laser Annealing and Its Application to Thin Film Transistors", by H. Kuriyama,T. Nohda, Y. Aya, T. Kuwahara, K. Wakisaka, S. Kiyama and S. Tsuda, published in Appl. Phys. vol. 33(1994) pp. 5657–5662, Part 1, No. 10, 10–94.

Article entitled, "Inverse Staggered Poly–Si and Amorphous Si Double Structure FT's for LCD Panels with Peripheral Driver Circuits Integration", by T. Aoyama, K. Ogawa, Y. Mochizuki and N. Konishi, published in IEEE Transactions on Electron Devices, vol. 43, No. 5, May 1006, pp. 701–705.

Article entitled, "Grain Growth in Laser Dehydrogenated and Crystallized Poly–crystalline Silicon for Thin Film Transistors", by P. Mei, J.B. Boyce, M. Hack, R. Lujan, S.E. Ready, D.K. Fork, R.I. Johnson and G.B. Anderson published in J. Appl. Phys. 76(5), Sep. 1, 1994, pp. 3194–3199.

*Primary Examiner*—George Fourson
*Attorney, Agent, or Firm*—David C. Ripma

[57] ABSTRACT

The invention provides a method of making silicon-on-glass substrates used in the manufacture of flat panel displays. A layer of amorphous silicon film is deposited on a glass substrate. The amorphous silicon is annealed by excimer laser annealing, transforming the amorphous silicon into polycrystalline silicon. The excimer laser annealing is carried out in a predominantly air ambient environment at atmospheric pressure and room temperature. The process requires no environmental chamber to house the substrate during excimer laser annealing. The process displaces the ambient air immediately surrounding the target region on the surface of the silicon film, where the laser beam strikes the silicon film, with inert gas. As a result, the ambient environment at the point of annealing on the substrate is depleted of oxygen and the oxygen content of the resultant polycrystalline silicon layer is kept below a predetermined level. The process yields polycrystalline silicon on the flat panel display substrates which have fewer defects and improved crystallization, compared with polycrystalline silicon formed by ELA in air.

17 Claims, 3 Drawing Sheets

METHOD OF CONTROLLING OXYGEN INCORPORATION DURING CRYSTALLIZATION OF SILICON FILM BY EXCIMER LASER ANNEAL IN AIR AMBIENT

BACKGROUND AND SUMMARY OF THE INVENTION

The invention relates generally to flat panel display manufacturing systems and more particularly to a method of preparing polycrystalline silicon films on flat panel display substrates.

Thin film transistors (TFTs) used in liquid crystal displays (LCDs) or flat panel displays of the active matrix type are fabricated on silicon films deposited on a transparent substrate. The most widely used substrate is glass and amorphous silicon is readily deposited on glass. To provide polycrystalline silicon (alternatively known as polysilicon or p-Si) suitable for TFTs requires crystallization of the as-deposited amorphous silicon. One method of obtaining polycrystalline silicon films on LCD substrates is solid-phase crystallization of deposited amorphous silicon. Solid-phase crystallization is carried out by high-temperature annealing, but glass substrates cannot withstand the temperatures necessary to melt and crystallize silicon. Quartz substrates can withstand high-temperature annealing, but quartz is too expensive for most LCD applications.

Because glass deforms when exposed to temperatures above 600° C., low-temperature crystallization (preferably below 550° C.) is used in solid-phase processing of LCD silicon. The low-temperature process requires long anneal times (at least several hours). Such processing is inefficient and yields polycrystalline silicon TFTs which have relatively low field effect mobility and poor transfer characteristics. Polycrystalline silicon produced by solid phase crystallization of as-deposited amorphous silicon on glass suffers due to small crystal size and a high density of intragrain defects in the crystalline structure.

Excimer laser annealing (ELA) has been actively investigated as an alternative to low-temperature solid-phase crystallization of amorphous silicon film on glass. In excimer laser annealing, a high-energy pulsed laser directs laser radiation at selected regions of the target film, exposing the silicon to very high temperatures for short durations. Typically, each laser pulse covers only a small area (several millimeters on a side) and the substrate or laser is stepped through an exposure pattern of overlapping exposures, as is well known in the art. More powerfull lasers with larger beam profiles are now available or are under active development, reducing the number of exposures required. Regardless of the number and pattern of exposures, excimer laser annealing allows areas of amorphous film to be crystallized without damage to the underlying glass substrate.

The major advantages of excimer laser annealing are the formation of polysilicon grains with excellent structural quality and the ability to process selected areas of a display panel. Polycrystalline silicon produced on transparent substrates by excimer laser annealing have electron mobility characteristics rivaling IC driver circuits currently mounted along the edges of the screen. Thus, it becomes possible to incorporate driver circuitry onto the substrate, simplifying manufacturing.

The most common problem that plagues excimer laser annealing is the narrow process window associated with the development of large and uniform grain sizes. Surface roughness inherent to the process is also troublesome. Research has suggested that improvements in surface conditions, a reduction in defects, and increased crystal size are associated with low oxygen content in ELA polycrystalline silicon films. Oxygen content can be controlled in several ways, the industry standard currently being to perform ELA in a high vacuum ($10^{-7}$ Torr) or, somewhat less efficacious, in a rough vacuum ($10^{-3}$ Torr). Alternatively, excimer laser annealing has been carried out in chambers filled with non-oxygen ambients such as He, Ar, or Ni with varying results. The association between oxygen content and polycrystalline silicon film quality is still being investigated, but applicant's present invention is directed to a method of controlling oxygen content in a way that is more practical and economical than prior art techniques.

A significant problem with prior art systems for reducing oxygen incorporation into polycrystalline silicon during ELA is the need for a process chamber to house the target substrate. When a process chamber (alternatively called: "chamber," "processing chamber," or "substrate isolation chamber") is used, the beam of the excimer laser must pass into the chamber through a quartz window. Vacuum chambers, in particular, are costly and the quartz windows cost several thousand dollars and have only a limited life, lasting only days or weeks in volume production. Chambers for processing in non-air ambients at near atmospheric pressure are somewhat simpler than vacuum chambers, but sill have costly quartz windows. The costs associated with processing chambers is one reason ELA equipment without substrate isolation chambers are still being manufactured, sold, and used. This despite evidence that ELA performed in air ambients produces polycrystalline silicon with inferior mobility characteristics (and a higher oxygen content) compared with films annealed in vacuum.

It would be advantageous to be able to effectively control the amount of oxygen incorporated in ELA polycrystalline silicon films, keeping the oxygen content below a predetermined threshold, while minimizing the cost of production.

It would also be advantageous to improve the quality of ELA polycrystalline silicon films on flat panel display substrates by performing excimer laser anneals in a predominantly air ambient at atmospheric pressure, eliminating the need for substrate isolation chambers that have costly quartz windows through which the laser beam must pass.

It would be additionally advantageous to improve the quality of ELA polycrystalline silicon films by reducing oxygen incorporation with relatively simple changes to ELA equipment designed for annealing in air ambients.

Accordingly, a method of forming polycrystalline silicon film on substrates used in flat panel displays is provided. The method comprises the steps of first depositing an amorphous silicon film on a substrate used in flat panel displays. The substrate is typically glass. The next step is to excimer laser anneal the amorphous silicon by irradiating one or more target regions of the silicon film with one or more exposures to excimer laser energy. The annealing step transforms the amorphous silicon layer into a polycrystalline silicon layer. The excimer laser annealing step includes providing an ambient environment for the silicon film and substrate which is at atmospheric pressure during the excimer laser anneal. And it further includes displacing the ambient atmosphere from the ambient environment of each target region by directing inert gas onto the surface of the silicon film during irradiation of the target region. In that way, the ambient environment of the silicon film is depleted of oxygen during the excimer laser anneal and the oxygen content of the resultant polycrystalline silicon layer is below a predetermined level.

In the preferred embodiment of the invention, the inert gas used in displacing the ambient atmosphere from the ambient environment of each target region of the silicon film is selected from the group consisting of argon and nitrogen. And among the gases suggested, argon is preferred. The ambient environment which is provided during the excimer laser annealing step is preferably predominantly air and it is the air immediately adjacent the surface of the silicon film which is displaced by the step of directing inert gas onto the surface of the silicon film It is further suggested that the best method of directing inert gas onto the surface of the silicon film, to displace the ambient (e.g., air) atmosphere, is to direct a continuous flow of inert gas over the surface of the amorphous silicon film. The suggested temperature at which the excimer laser anneal step is performed is room temperature or, alternatively, a temperature of less than 70° C.

The present invention can be used to transform amorphous silicon into polycrystalline silicon on flat panel display substrates (alternatively referred to herein as liquid-crystal display, or LCD, substrates) of any size. Accordingly, the step of irradiating target regions of the silicon film can require exposure of only a single target region to cover the entire substrate or, more commonly, numerous target regions. Since ELA is customarily performed using small cross section laser beams which cover only a fraction of the LCD panel being processed, the irradiating step is typically performed by irradiating successive target regions on the silicon film until the process in complete. Completing the process means either irradiating successive target regions until the entire surface of the silicon film has been excimer laser annealed, or irradiating whichever selected sub-areas or predetermined areas of the film are targeted for conversion to polycrystalline silicon. Yet another alternative variation on the irradiation step is to use a broad cross-section, so-called "single shot" ELA laser which covers the entire surface of the silicon film, in which case only a single target region will be exposed in the process.

The method of the present invention, if carried out in a predominantly air ambient, allows for the displacing of air with inert gas which is directed either at a limited sub-region of the silicon film in the target region of the film where excimer laser annealing is performed, or which floods the entire surface of the silicon film with inert gas during the entire excimer laser annealing process. In the latter alternative, the flow of inert gas is not directed to any specific target area and the entire surface of the silicon film is displaced of air by inert gas while successive target regions are annealed. Regardless of the size of the region wherein air is displaced by inert gas, the purpose of the process is to deplete the ambient environment of oxygen during excimer laser annealing whereby the oxygen content of the resultant polycrystalline silicon layer is maintained below a predetermined level, preferably below 0.5 atomic percent.

DETAILED DESCRIPTION OF THE PREFERRED EMBODIMENT

Figure 1:
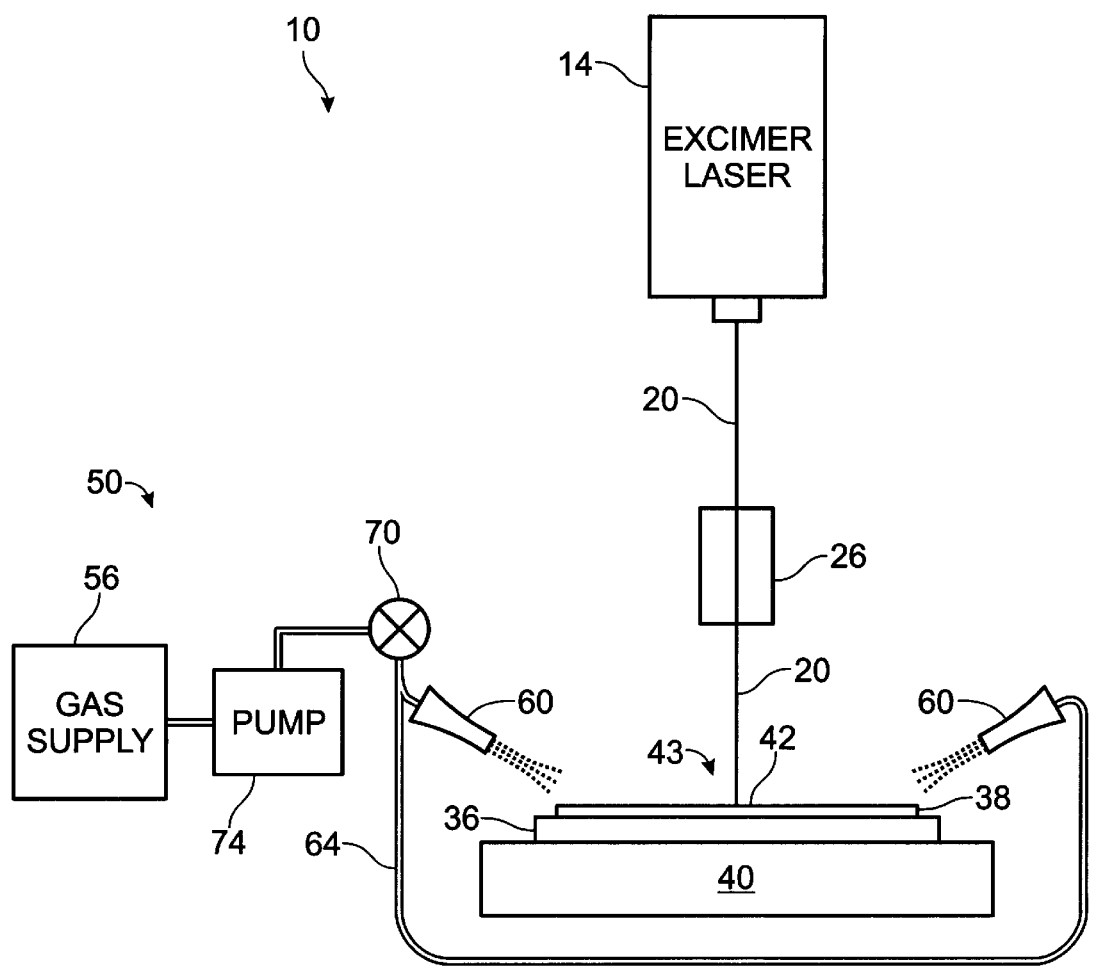
FIG. 1 is a schematic drawing of an excimer laser annealing apparatus adapted for carrying out the method of the present invention.

FIG. 1 is a schematic illustration of the components of an excimer laser annealing (ELA) apparatus 10. Several manufacturers supply excimer laser annealing systems suitable for use with the method of the present invention, including Sopra, S.A. of France, Lambda Physik of Germany, and XMR, Inc. of Fremont, Calif. Excimer lasers and related systems are well known to those skilled in the art of excimer laser annealing and the present method is suitable for use with any ELA system designed to transform amorphous silicon film deposited on liquid crystal display substrates into polycrystalline silicon films.

Excimer laser annealing apparatus 10 includes a laser head 14 which emits high-energy coherent radiation at a selected wavelength. The type of laser used is a matter of design choice. For example, XeCl lasers emit UV radiation at a wavelength of 308 nm; KrF lasers operate at a wavelength of 248 nm. Laser 14 emits a pulsed beam 20 which is adjustable to various energy levels. Pulse durations can be varied over a wide range, typically 10–200 nm, and the pulse repetition rates are generally selectable between 0.1 Hz and 50 Hz. Beam cross-sections can vary widely depending on the power level of the laser and the type of optics used in the apparatus, as will be discussed below. None of the operational parameters of any particular excimer laser system is incompatible with the present invention and the process can be performed using lasers which operate within or outside the numerical ranges suggested in this paragraph.

Laser 14 emits a beam 20 that passes through a beam homogenizer 26, which is an optical system that produces a substantially uniform beam profile as it strikes the target surface. The size of the beam 20 as it emerges from homogenizer 26, and any other related optics (not shown), determines the size and configuration of the target area on the substrate which will be irradiated by laser beam 20. Beam profiles vary substantially from typical beams of between 10- and 50-mm$^2$ up to so-called "single shot" ELAs capable of annealing entire flat panel displays in a single exposure.

The target toward which laser beam 20 is aimed is a flat panel display substrate 36 onto which a layer of amorphous silicon film 38 has previously been deposited. Substrate 36 is supported in apparatus 10 on a movable stage 40 of any suitable type capable of repositioning substrate 36 in a programmable manner to ensure that successive target regions 43 (where the beam 20 strikes film 38) on the substrate are sequentially or repeatedly irradiated. It will, of course, be readily understood that the function of movable stage 40 could be alternatively accomplished by moving laser head 14 and the related optics relative to a fixed stage, or by redirecting beam 20 to aim it at different target regions on substrate 36. Whichever way the function is accomplished, the purpose of ELA apparatus 10 is to expose selected areas of the surface 42 of amorphous silicon layer 38, which has been deposited on substrate 36, to excimer laser energy by irradiating one or more target regions of the silicon.

The power level of laser 14, the duration of the laser pulses emitted, and size of laser beam 20 will determine the number of exposures or "shots" to which each target region on substrate 36 is exposed. ELA systems are readily programmed to perform multiple exposures, sometimes 100 exposures or more, on each sub-region or target area of the substrate, in order to properly anneal and crystallize the amorphous silicon film. The method of the present invention is not limited to any specific laser annealing parameters and can be readily used with excimer lasers of any suitable power level programmed to deliver single shots or multiple shots of laser energy to each target area. If the laser 14 has sufficient power and beam 20 sufficient cross-section to "shoot" the entire surface area of substrate 36 in a single exposure, the method will require irradiation of only a single "target region" on the substrate. In such a case the method described below will not require the irradiation of successive target regions of the silicon film. In most applications the method will require irradiation of successive target region of the silicon film 38, until either the entire film layer is transformed into polycrystalline silicon or a predetermine portion (in selected areas) of the film has been transformed.

A particular advantage of the present invention is that ELA apparatus 10 does not require an environmental chamber or the like in which substrate 36 is enclosed during excimer laser annealing. Such chambers are generally designed to be evacuated to either a high or rough vacuum, or are designed to contain controlled ambient atmospheres. In ELA systems which include such environmental chambers, the beam 20 from laser 14 enters the chamber through a suitable window, generally made of quartz. The chamber, window, pumps, and other equipment associated with substrate isolation chambers are not needed when carrying out the method of the present invention. Instead in apparatus 10, laser 14, movable stage 40, and the target substrate 36 can be positioned in a conventional LCD-processing clean room environment, which will also include suitable substrate handlers and conveyers (not shown) for positioning LCD substrates on X-Y stage 40.

The ELA apparatus 10 adapted for carrying out the method of the present invention includes an inert gas supply system 50 for directing inert gas onto the surface of the silicon film 38 on substrate 36. Inert gas supply system 50 includes one or more reservoirs 56 of a suitable inert gas, preferably argon (Ar) or nitrogen (Ni). The reservoir 56 can contain liquefied gas if fitted with a suitable vaporizer, or it can be a gas reservoir.

Inert gas supply reservoir 56 is operatively connected to one or more nozzles 60 through suitable manifolds or conduits 64 which deliver inert gas to the region of the surface 42 of silicon film layer 38 on substrate 36. One or more valves 70 and pumps 74 are optionally provided to control the flow of inert gas from supply 56 to nozzles 60. The number, shape, size, and configuration of nozzles 60 is a matter of design choice and optimization and the nozzles can take a variety of forms such as a shower head, multiple individual nozzles, or one or more elongated laminar flow-type apertures.

The purpose of inert gas supply 50 is to direct inert gas, preferably argon or nitrogen, onto the surface 42 of silicon film 38 during irradiation of the target region 43 by laser beam 20. The gas displaces the ambient atmosphere from the ambient environment of target region 43 during one or more exposures of the target region to excimer laser energy. It will be readily understood by those skilled in the art that the number and configuration of nozzles 60 is a matter of design choice which depends on factors such as the size and orientation of the target surface 42, the size and profile of excimer laser beam 20, the type and volume of inert gas supplied, and the process conditions selected for the ELA.

The nozzles can either move with X-Y stage 40 (i.e., remain stationary relative to the substrate 36) or remain stationary while stage 40 moves, depending on whether oxygen is to be displaced more or less continuously from the entire surface 42 of silicon film 38 during ELA, or displaced from only from the limited target area 43. In the first option, nozzles 60 would be configured to flood the entire surface 38 of silicon film 36 during the excimer laser annealing of each target region until all selected or predetermined target regions on film 38 have been annealed. In the second option, the nozzles 60 would be fixed relative to beam 20 and direct inert gas to target region 43 while the position of substrate 36 moves to successive target positions. Thus, the ambient atmosphere would be displaced by inert gas from each target region on surface 42 of silicon film 38 as the targeted region is annealed.

Figure 2:
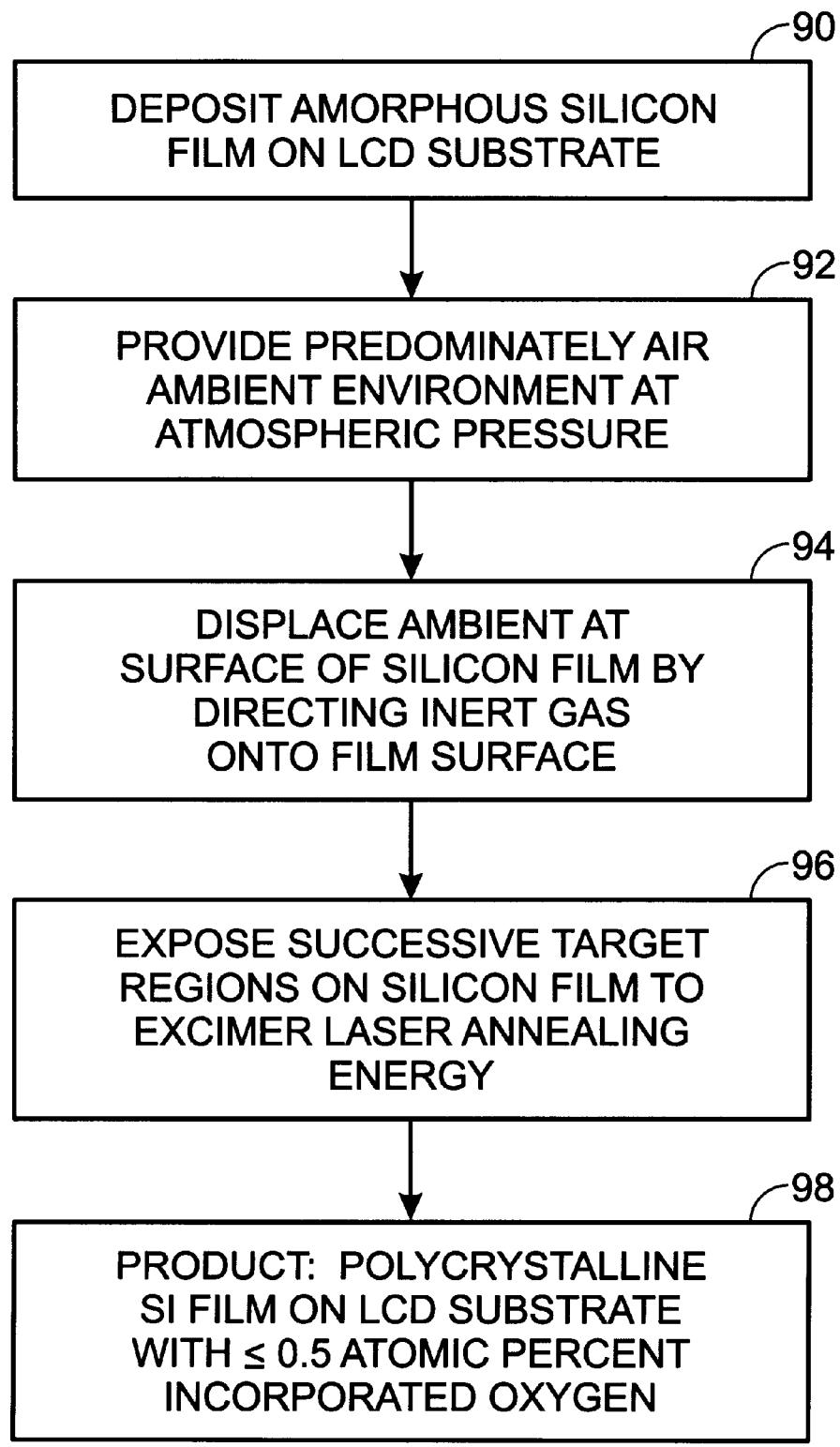
FIG. 2 is a flow chart showing the steps in the method of controlling oxygen incorporation during excimer laser anneal in a predominantly air ambient in accordance with the present invention.

FIG. 2 shows the steps in the method of the present invention. The initial step 90 is the preparation of a suitable flat panel display substrate on which is deposited an amorphous silicon film. A glass substrate 36 (FIG. 1) is assumed in this process, although plastic substrates or others could be used with the method of the present invention. A layer of amorphous silicon (a-Si) is deposited on the glass substrate by any suitable means, for example, plasma enhanced chemical vapor deposition (PECVD). If a barrier layer is used, such as silicon dioxide, it is first deposited on the glass, preferably using PECVD. A typical thickness range for the a-Si film on substrate 36 is generally in the range of 20–200 nm. The dimensions of the substrate in step 90 are unimportant to the method of the present invention and any size flat panel display can be used in this process.

The next steps in the method 92, 94, 96 are performed substantially simultaneously. The substrate produced in step 90 is positioned on a suitable excimer laser annealing apparatus 10 as described with reference to FIG. 1. In step 92, an ambient environment is provided for the silicon film and substrate which is at atmospheric pressure. The process can be carried out at any temperature suitable for excimer laser annealing and room temperature is recommended because it is the easiest to provide. Alternatively, a temperature below 70° C. is recommended. The ambient atmosphere is preferably air because that is the simplest ambient atmosphere to provide and the present invention is directed to mass production manufacturing of flat panel displays. The present invention is intended to be carried out in air in a typical clean room environment of any suitable type.

Although the method and step 92 are described herein as taking place in an air ambient, it is more accurately described as a predominately air ambient. An essential part of the process is the displacement of the ambient atmosphere from the surface of the silicon film on substrate 36 during excimer laser annealing by an inert gas. That, of course, means that in the immediate and critical region where the excimer laser beam 20 strikes the surface 42 of silicon film 38 (i.e., target region 43), the ambient atmosphere is, in fact, inert gas, not air. Nevertheless, the laser 14 supporting stage 40, and all peripheral equipment are in an air ambient, which simplifies the carrying out of the process. The purpose of the present invention is to eliminate the need for an environmental chamber of some kind to house the substrate during ELA. The invention accomplishes this simply, by displacing the air in the critical target region immediately adjacent the surface 42 of silicon film 38 during the critical time when excimer laser annealing of each target region is carried out. Thus, the process is properly described as being carried out in an air ambient, or a predominantly air ambient, because a very large percentage of the atmosphere surrounding the equipment carrying out the process is the ambient atmosphere of the room in which it is taking place.

The next step in the method, step 94, is the displacing of the ambient atmosphere from the ambient environment of each target region on the surface of the silicon film. This step is performed by inert gas supply 50, which directs a selected inert gas onto the surface 42 of film 38 during irradiation of each target region 43. The preferred inert gases used in step 94 are either argon or nitrogen. Experimentation has shown some slight tendency of nitrogen to combine with silicon during excimer laser annealing, forming N—Si compounds, although the effects of such compounds in the crystalline silicon film are not fully known. For that reason, although nitrogen is a well-known inert gas, it is perhaps slightly reactive under ELA conditions. For that reason, applicant recommends he use of argon at the present time, although further experimentation ay demonstrate the equal suitability of nitrogen for use in step 94.

Step 94 displaces the air or other ambient atmosphere from the ambient environment of each target region 43 on silicon film 38 during irradiation of the target region by laser beam 20. The reason for displacing the ambient atmosphere is to deplete the ambient environment adjacent the silicon film of oxygen during excimer laser anneal. If the ambient environment is depleted of oxygen during ELA, the oxygen content of the resultant polycrystalline silicon layer is reduced. It is the goal of the present invention to keep the oxygen content of the polycrystalline silicon layer below a predetermined level, preferably 0.5 atomic percent. That is the level above which the quality of the polycrystalline silicon degrades. The present invention provides a simple and cost-effective method of ELA processing that yields polycrystalline silicon films having an oxygen content in the crystalline structure that is below 0.5 atomic percent.

The next step, step 96, is the excimer laser annealing step. The amorphous silicon film 38 is exposed to excimer laser energy simultaneously with steps 92 and 94. As was described above with reference to FIG. 1, the typical excimer laser annealing apparatus performs ELA by irradiating successive target regions of the silicon film with one or more exposures to excimer laser energy to transform the amorphous silicon layer into a polycrystalline silicon layer. Alternatively, if the substrate 36 is sufficiently small or the size of beam 20 is sufficiently large, a single target region 43 could cover the entire surface area of silicon film 38 in a single shot or exposure. Consequently, step 96 is most broadly characterized as excimer laser annealing the amorphous silicon by irradiating one or more target regions of the silicon film with one or more exposures to excimer laser energy. Regardless of the number of target regions which must be individually exposed, step 96 is carried out simultaneously with step 92 and with the step (94) of displacing the ambient atmosphere from the ambient environment of the target region by means of inert gas directed onto the surface of the silicon film.

In a typical state-of-the-art ELA process for large flat panel displays, step 96 will involve irradiating successive target regions of the film with one or more exposures (or "shots") of excimer laser energy, followed by a repositioning of the relative positions between the target region 43 on substrate 36 and laser beam 20. Such repositioning is accomplished, in the apparatus of FIG. 1, by the X-Y movement of movable stage 40 relative to laser 14.

Once step 96 is completed, the product 98 of the process is a flat panel display substrate with a film of polycrystalline silicon suitable for further processing into thin film transistors (TFTs) and other active devices. The content of the polycrystalline silicon layer 38 on substrate 36 is below a predetermined level, preferably 0.5 atomic percent.

The flow characteristics of the inert gas supplied during step 94 is a matter of process optimization and selection. The inert gas will have a certain cooling effect which may or may not be desirable in the ELA processing of a particular film of amorphous silicon. Factors such as the thickness of the deposited amorphous silicon film on the substrate, ambient temperature conditions during processing, and the inert gas used in the process, will affect the selection of the flow rate of inert gas in step 94. For example, the gas could be supplied in a short burst or pulse which will displace the ambient atmosphere long enough to complete the irradiation of a target region on the substrate, after which another burst or pulse of gas is delivered to a new target region. Alternatively, the preferred methodology could be to maintain a continuous flow of inert gas over surface of the silicon film during the entire ELA process. The latter option would increase the cooling effect of the inert gas which would modify the rate or quality of the crystallization which occurs. Similarly, the ambient temperature at which steps 92, 94, and 96 are performed is a matter of optimization and design choice. As noted above, the method of the present invention is adapted to be carried out at room temperature to simplify the provision of suitable ambient conditions. A suggested alternative is to carry out the method at an ambient temperature of 70° C. or less.

Figure 3:
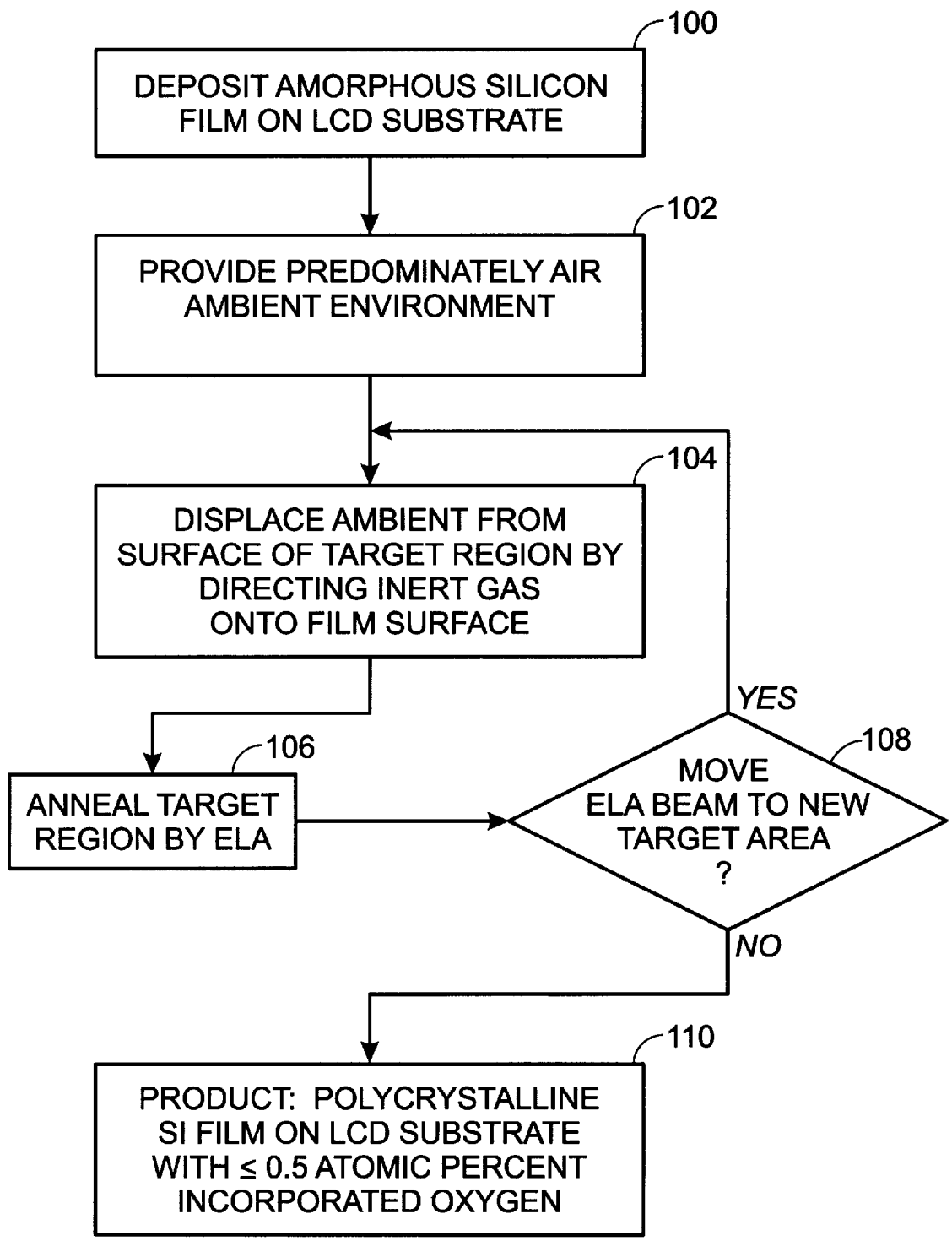
FIG. 3 is a flow chart as in FIG. 2 showing the steps in an alternative embodiment of the present invention.

FIG. 3 illustrates an alternative embodiment of the steps of the present invention. In the embodiment of FIG. 3, the ELA process is carried out on successive target regions of the silicon film on substrate 36 (FIG. 1) until all selected target regions have been processed. The initial step in the embodiment of FIG. 3 is step 100, which is the same as step 90 in the embodiment of FIG. 2. The next step in the embodiment of FIG. 3 is step 102 which is the same as step 92 in the embodiment of FIG. 2, assuming a predominantly air ambient environment. The next step in the embodiment of FIG. 3 is step 104, displacing the air from a target region of the surface of the silicon film by directing inert gas onto the surface of the silicon film. Step 104 is carried out by inert gas supply 50 of FIG. 1, the inert gas, preferably argon or nitrogen, being directed at the surface 42 of the silicon film 38 via nozzles 60.

The next step in the embodiment of FIG. 3 is step 106, which is excimer laser annealing the amorphous silicon in the target region by irradiating the silicon film with one or more exposures to excimer laser energy while step 104 is being carried out. Step 106 is equivalent to step 96 in FIG. 2.

Step 108, as depicted in FIG. 3, is a yes/no decision point wherein the process returns to and repeats steps 104 and 106 for successive target regions of the silicon film until the amorphous silicon film on the substrate has been transformed into polycrystalline silicon film. Once all the selected target regions on the substrate have been transformed into polycrystalline silicon film, the process is completed. Yes/no decision point 108 controls the irradiation of successive target regions on the silicon film. When all or a predetermined number of target regions on the film have been transformed into polycrystalline silicon, as determined when the ELA equipment 10 is programmed, the ELA process is stopped. Once the predetermined areas of the substrate have been crystallized, covering either the entire surface of the silicon film 38 or selected regions, the result is product 110. The produce is a substrate which has polycrystalline silicon on its surface, the polycrystalline silicon having an oxygen content below 0.5 atomic percent. As noted above, that reduced oxygen content results from the ELA step 106 being performed in an ambient environment which is substantially depleted of oxygen.

What follows are examples of the processing of a flat panel display in accordance with the method of the present invention.

EXAMPLE

Amorphous silicon, 500 Å-thick, is deposited by plasma-enhanced chemical-vapor-deposition (PECVD) on a transparent substrate with or without a base coat (i.e. 2000 Å $SiO_2$ layer). The film is subjected to a low-temperature (400–450° C.) annealing step to drive out hydrogen that is typically incorporated into the silicon film during deposition. Other deposition techniques (i.e. physical vapor deposition, PVD) could be utilized to eliminate the need for the low-temperature dehydrogenation step. Then the film is laser annealed using an excimer laser (i.e. XeCl at 308 nm) in the following manner:

The substrate with the deposited silicon film is loaded on an X-Y moving stage. This is an open configuration (i.e. no chamber necessary). The laser beam, generated by means of an optical system, is directed on the surface of the film. A homogenizer is included in the path of the beam to improve the uniformity of the laser beam profile. At the same time, inert gas is flowing above the surface of the film in a direction parallel to the film's surface. The gas flow is typically higher than 0.5-liters/minute. Alternatively, the gas can be flowed through a nozzle assembly attached to the optical system that fixed to the laser. In this example, inert gas flows in a direction almost perpendicular to the film's surface.

As the X-Y stage on which the substrate with the film is situated moves around, different regions of the film are brought under the beam and undergo crystallization. A typical beam size for this geometry is 3–4 square inches. Assuming a substrate size of 360×465 $mm^2$, 29–65 single shots are necessary to cover the whole area of the panel. Preferably 2–3 shots are delivered on each area to improve the crystalline characteristics of the film, increasing the number of shots to 87–195 per panel. This type of excimer laser can deliver 6 to 15 shots per second, so the time to anneal the full panel is determined by the movement of the X-Y stage from region to region, rather than the discharge rate of the laser.

The inert gas that is continuously flowing (by either of the two proposed configurations) effectively purges air from the surface of the silicon film, thus reducing the amount of oxygen that can be incorporated into the film that undergoes crystallization. In this manner, control of the oxygen content is possible at or below 0.5 at %. Without the inert gas purge the oxygen content of the polycrystalline silicon film would increase to about 3.4 at %. Argon can be used as the inert gas, as it doesn't form any compounds with the silicon film. However, nitrogen gas may also be applied to achieve the same objective.

The present invention provides a simple and cost-effective means for reducing the oxygen content of polycrystalline silicon films annealed by ELA. It reduces the cost of producing flat panel displays while improving the quality of silicon films on glass.

Alternative embodiments within the scope of the present invention will occur to those skilled in the art of ELA processing. For example, the types and configurations of inert gas supply nozzles discussed above are suggestive only and other systems are possible for displacing the air form target regions on silicon film during ELA. The equipment for performing ELA is continuously evolving and the configuration shown if FIG. 1 is suggestive only.

What is claimed is:

1. A method of forming polycrystalline silicon film on substrates used in flat panel displays, comprising the following steps:

a) depositing an amorphous silicon film on a substrate used in flat panel displays;

b) excimer laser annealing the amorphous silicon by irradiating one or more target regions of the silicon film with one or more exposures to excimer laser energy to transform the amorphous silicon layer into a polycrystalline silicon layer, the excimer laser annealing step including:

i) providing an ambient environment for the silicon film and substrate which is at atmospheric pressure during the excimer laser anneal; and ii) displacing the ambient atmosphere from the ambient environment of each target region by directing inert gas onto the surface of the silicon film during irradiation of the target region, whereby the ambient environment of the silicon film is depleted of oxygen during the excimer laser anneal and the oxygen content of the resultant polycrystalline silicon layer is below a predetermined level.

2. A method of forming polycrystalline silicon film on flat panel displays as in claim 1 in which, during the excimer laser annealing step, the gas directed onto the surface of the silicon film to displace the ambient atmosphere is selected from the group consisting of argon and nitrogen.

3. A method of forming polycrystalline silicon film on flat panel displays as in claim 1 in which the step of excimer laser annealing is carried out in an ambient atmosphere which is predominately air and includes the step of displacing the air from the ambient environment of each target region by inert gas.

4. A method of forming polycrystalline silicon film on flat panel displays as in claim 1 in which the step of excimer laser annealing includes directing a flow of inert gas over the surface of the amorphous silicon film in the target region during irradiation of each said target region.

5. A method of forming polycrystalline silicon film on flat panel displays as in claim 1 in which the step of providing an ambient environment for the silicon film and substrate during the excimer laser annealing step further includes providing an ambient environment which is at room temperature.

6. A method of forming polycrystalline silicon film on flat panel displays as in claim 1 in which the step of irradiating one or more target regions of the silicon film includes irradiating successive target regions on the silicon film until predetermined areas of the silicon film have been transformed into polycrystalline silicon.

7. A method of forming polycrystalline silicon film on substrates used in flat panel displays, comprising the following steps:

a) depositing an amorphous silicon film on a substrate used in flat panel displays;

b) providing an ambient environment for the silicon film and substrate which is predominately air at atmospheric pressure;

c) in said ambient environment, displacing the air from a target region of the surface of the silicon film by directing inert gas onto the surface of the silicon film;

d) while displacing the air from the target region, excimer laser annealing the amorphous silicon in the target region by irradiating the silicon film with one or more exposures to excimer laser energy; and e) repeating steps c) and d) for successive target regions of the silicon film until the amorphous silicon film on the substrate has been transformed into a polycrystalline silicon film, whereby excimer laser annealing is performed on each target region in an ambient environment which is depleted of oxygen and the oxygen content of the resultant polycrystalline silicon layer is below 0.5 atomic percent.

8. A method of forming polycrystalline silicon film on flat panel displays as in claim 7 in which the step of displacing air from the target region of the surface of the silicon film includes directing a gas selected from the group consisting of argon and nitrogen onto the surface of the silicon film.

9. A method of forming polycrystalline silicon film on flat panel displays as in claim 7 in which step c) includes directing a continuous flow of inert gas over the surface of the amorphous silicon film in the target region.

10. A method of forming polycrystalline silicon film on flat panel displays as in claim 7 in which step c) further includes directing a continuous flow of inert gas over the entire surface of the amorphous silicon film on the substrate.

11. A method of forming polycrystalline silicon film on flat panel displays as in claim 7 in which steps b) through e) are carried out in an ambient environment which is at a temperature of less than 70° C.

12. A method of forming polycrystalline silicon film on substrates used in flat panel displays, comprising the following steps:
   a) depositing an amorphous silicon film on a substrate used in flat panel displays;
   b) providing an ambient environment for the silicon film and substrate which is predominately air at atmospheric pressure;
   c) in said ambient environment, displacing the air from the surface of the silicon film by directing a flow of inert gas onto the surface of the silicon film; and
   d) excimer laser annealing the amorphous silicon by irradiating one or more target regions of the silicon film with one or more exposures to excimer laser energy to transform the amorphous silicon layer into a polycrystalline silicon layer, whereby excimer laser annealing is performed in an ambient environment which is depleted of oxygen and the oxygen content of the resultant polyciystalline silicon layer is below a predetermined level.

13. A method of forming polycrystalline silicon film on flat panel displays as in claim 12 in which the step of displacing air from the target region of the surface of the silicon film includes directing a flow of gas selected from the group consisting of argon and nitrogen onto the surface of the silicon film.

14. A method of forming polycrystalline silicon film on flat panel displays as in claim 12 in which step b) further includes providing an ambient environment which is at a temperature of less than 70° C.

15. A method of forming polycrystalline silicon film on flat panel displays as in claim 14 in which step b) further includes providing an ambient environment which is at room temperature.

16. A method of forming polycrystalline silicon film on flat panel displays as in claim 12 in which the depletion of oxygen in the ambient environment during excimer laser annealing produces an oxygen content in the resultant polycrystalline silicone layer which is below 0.5 atomic percent.

17. A method of forming polycrystalline silicon film on flat panel displays as in claim 12 in which the step of excimer laser annealing includes irradiating successive target regions on the silicon film until predetermined areas of the silicon film have been transformed into polycrystalline silicon.

* * * * *